United States Patent [19]
Jandu et al.

[11] Patent Number: 4,964,078
[45] Date of Patent: Oct. 16, 1990

[54] COMBINED MULTIPLE MEMORIES

[75] Inventors: Jaswinder S. Jandu; Trevor S. Smith, both of Mesa, Ariz.

[73] Assignee: Motorola, Inc., Schaumburg, Ill.

[21] Appl. No.: 352,302

[22] Filed: May 16, 1989

[51] Int. Cl.$^5$ .............................................. G11C 5/06
[52] U.S. Cl. ........................................ 365/51; 365/63
[58] Field of Search ..................... 365/51, 63, 189.02, 365/230.02

[56] References Cited
U.S. PATENT DOCUMENTS
4,402,065 8/1983 Taylor ............................ 365/189.02

*Primary Examiner*—Joseph A. Popek
*Attorney, Agent, or Firm*—Michael D. Bingham; Robert D. Atkins

[57] ABSTRACT

A combined multiple memory array is disclosed which includes at least two differing types of memory arrays located next to and aligned to one another. The individual memory cells of the differing memory arrays are designed wherein the x pitches may vary in order to allow the y pitches to be substantially equal. A common set of row decoders provide common wordline decoding to the differing memory arrays. The memory arrays need not have the same number of words or bits to share the common row decoders. The column decoders may be separate for each array to account for different word sizes. A common set of column decoders is possible with equal word lengths from each array. A significant savings in silicon area may be saved by combining the multiple arrays.

12 Claims, 1 Drawing Sheet

COMBINED MULTIPLE MEMORIES

FIELD OF THE INVENTION

This invention relates in general to the field of memory systems, and more particularly, to a combined memory system which merges pitch matched arrays of different types of memory, for example, Random Access Memory (RAM), Read Only Memory (ROM), Electrically Programmable ROM (EPROM), or some combination thereof.

BACKGROUND OF THE INVENTION

Many electronic circuits, typically microprocessor based circuits, are required to store digital information either temporarily or permanently, and must further access the information quickly. Furthermore, it is common for many electronic circuits to require both temporary and permanent data storage in the same system. The number of bits required for storage and thus the number of memory cells may vary considerably from system to system. Because the number of storage bits required may be large, it is advantageous to increase the density of memory bits for a given area.

Application Specific Integrated Circuits (ASICs) is an example of an application that often requires different combinations of memory, and each type of memory in different amounts. The memories are typically each placed in separate locations on the chip, each being a stand alone memory system. Typically each memory consists of memory cells arrayed in an x-y array having row decoders located along the y axis to provide word decoding and having column decoders located along the x axis for providing bit decoding. The memory cells of each memory array each have an x and y pitch (width and height of each cell, respectively) which are typically matched to the y pitch of the row decoders and to the x pitch of the column decoders, respectively.

Since the array of the memory cells normally takes up the majority of area, the memory cell is designed first to be as compact as possible both in the x and y pitches. The row and column decoders are then designed to match the already determined x and y pitches of the memory cells. This is an efficient and effective method of design, especially in large memories. In ASIC applications, where the number of memory cells generally are not large, the row and column decoders take a proportionately larger amount of area. Furthermore, Random Access Memories (RAM) cells are typically larger than Electrically Programmable Read Only Memory (EPROM) cells which in turn are larger than Read Only Memory (ROM) cells.

ASIC applications which require differnt types of memories in varying amounts, often are not required to access the different memories on the same clock cycle (or asynchronously). The different types of memories may then be accessd individually, usually putting their addressed contents onto a bus. In effet the row decoders, and in some cases the column decoders of each memory array are redundant and moreover require a significant amount of area. If the smaller memory cells were designed to be pitched matched to the largest memory cell, then the row and/or column decoders could be shared. This is especially efficient when there are smaller amounts of the smaller memory cells.

Pitched matched arrays may be configured using conventional Computer Aided Design (CAD) techniques. However hierarchical structured design methods, and more particularly, silicon compilers, having made it more efficient in laying out such an integrated circuit design. The silicon compiler may take a high level description of the system and convert it into a parameterized layout of the circuit. Although the initial preparation of the design software may consume a lenghty time period, subsequent circuit design for multiple circuits requires substantially less time. Once the x and y pitches of the largest memory cell are determined, these parameters may be used to quickly layout other pitch matched memories.

Thus, what is needed is a combined memory system which merges pitched matched arrays of different types of memory, for example, Random Access Memory (RAM), Read Only Memory (ROM), Electrically Programmable ROM (EPROM), or some combination thereof.

SUMMARY OF THE INVENTION

Accordingly, it is an object of the present invention to provide an improved memory system.

It is further an object of the present invention to provide a memory system having different memory arrays sharing a common decoder.

It is yet a further object of the present invention to provide a combined memory system having pitch matched arrays.

In carrying out the above and other objects of the invention in one form, there is provided a monolithically integrated memory system comprising a row decoder coupled for receiving an address for providing a plurality of word lines wherein only one of the word lines is active at any given time. The row decoder includes a plurality of decoder cells that are pitch matched to the largest memory cell of multiple but different memory arrays. A first memory array for storing digital information is coupled to the row decoder for receiving at least one of the plurality of word lines, the first memory array having a plurality of cells, each of the cells having an x and a y pitch. A second memory array for storing digital information in a manner different from the first memory array is coupled to the row decoder, the second memory array having a plurality of cells being spaced and aligned with respect to the first memory array and, each of the cells having an x and a y pitch, wherein the x pitch is different than the x pitch of the cells of the first memory array and the y pitch of the cells of said first and second memory arrays are substantially equal.

The above and other objects, features, and advantages of the present invention will be better understood from the following detailed description taken in conjunction with the accompanying drawings.

DETAILED DESCRIPTION OF THE INVENTION

Figure 1:
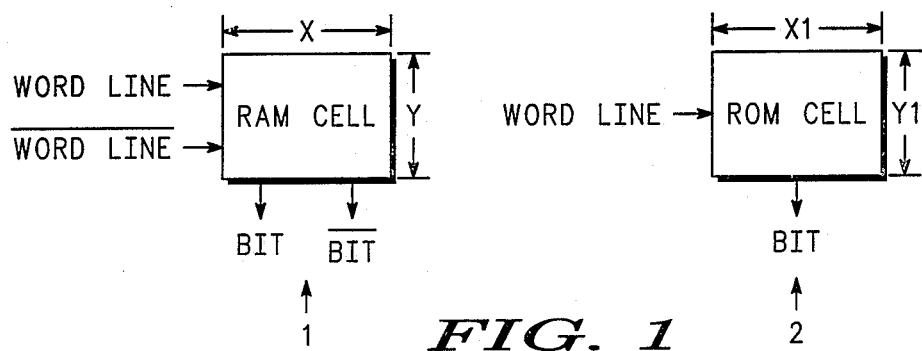
FIG. 1 is a block diagram of a Static RAM cell and a ROM cell.

In FIG. 1 a Random Access Memory (RAM) cell 1 is compared to a Read Only Memory (ROM) cell 2. The RAM cell 1 normally contains four to six devices while the ROM cell 2 normally contains one device. The RAM cell 1, therefore, typically consumes about four times the area as that of the ROM cell 2 for a given technology. Furthermore, the RAM cell 1 requires a wordline and a wordline for selection and outputs a bit and a bit. The ROM cell 2 requires only a wordline for selection and outputs only a single bit. The width of the RAM cell 1 is shown by the distance x which is the x pitch, and the height is shown by the distance y which is the y pitch. Similarly the x and y pitches of the ROM cell 2 are shown by x1 and y1, respectively. While the RAM cell 1 is significantly larger than the ROM cell 2, the pitches y and y1 may be made to match by increasing the x pitch and decreasing the x1 pitch. It is further possible to include two or four bits of ROM in the ROM cell 2 with additional decoding being done at the respective column decoders in order to more efficiently match the areas of the RAM and ROM cells 1 and 2. The RAM and ROM cells 1 and 2 are given only as an example as the pitch matching is applicable to all types of memory cells.

Figure 2:
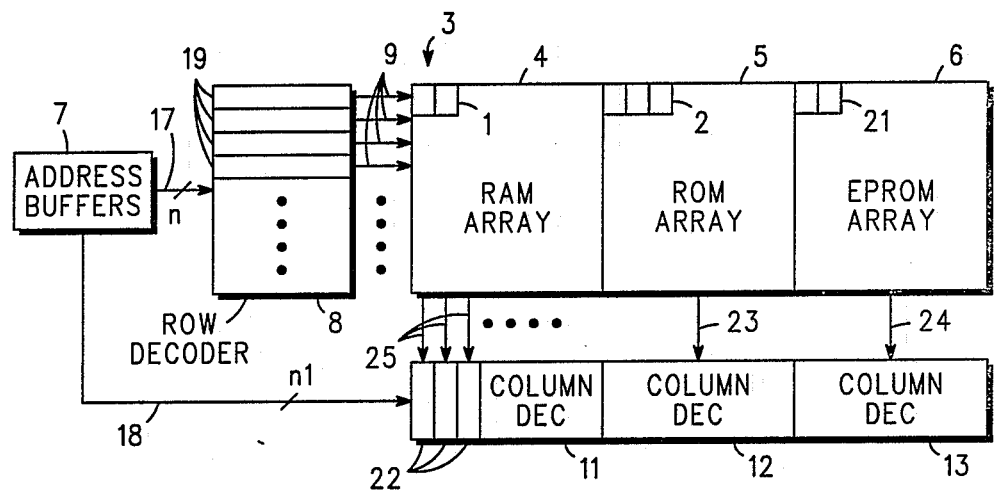
FIG. 2 is a block diagram of the present invention.

FIG. 2 shows a partial memory system 3 wherein a RAM array 4, a ROM array 5, and an Electrically Programmable ROM array 6 have been combined. The RAM array 4 comprises a plurality of RAM cells 1, the ROM array 5 comprises a plurality of ROM cells 2, and the EPROM array comprises a plurality of EPROM cells 21. Address buffers 7 receive an address for selecting a particular bit of memory from one of the memory arrays 4, 5, or 6. The address buffers 7 are connected to a row decoder 8 by a bus 17 having n bits, and a column decoder 11, a column decoder 12, and a column decoder 13 by a bus 18 having n1 bits. The Address buffers 7 provide additional drive for address signals on the busses 17 and 18. The row decoder 8 is made up of a plurality of decoder cells 19, the row decoder 8 being connected to the RAM array 4, the ROM array 5, and the EPROM array 6 by a plurality of wordlines 9.

Each decoder cell 19 is pitch matched in the y direction to the RAM cell 1 which is further pitch matched to the ROM cell 2 and the EPROM cell 21 in the y direction. The x pitches of the RAM cell 1, the ROM cell 2, and the EPROM cell 21 are not typically pitch matched. A plurality of bit lines 25 from the RAM array 4 are connected to the column decoder 11. The column decoder 11 comprises a plurality of decoder cells 22 wherein the decoder cells 22 are typically pitch matched in the x direction to the RAM cells 1. Similarly the ROM array is connected to the column decoder 12 by a plurality of bit lines 23, and the EPROM array 6 is connected to the column decoder 13 by a plurality of bit lines 24.

When the address buffers 7 receive a new address, the address signals on the busses 17 and 18 are decoded by the row decoders 8 and the column decoders 11, 12, and 13, respectively. As a result, one of the plurality of wordlines 9 will become active and a row each of the RAM cells 1, the ROM cells 2, and the EPROM cells 21 will be selected. Simultaneously, the column decoders will select a plurality of bits from one of the RAM cells 1, the ROM cells 2, or the EPROM Cells 21. It is not necessary to have the same size words (same number of bits per wordline) for the RAM array 4, the ROM array 5 or the EPROM array 6 since the column decoders 11, 12, and 13 may have varying numbers of decoder cells. The RAM cells 1, ROM cells 2, and EPROM cells 21 are used here as an example several alternative memory types could be used in their place.

Figure 3:
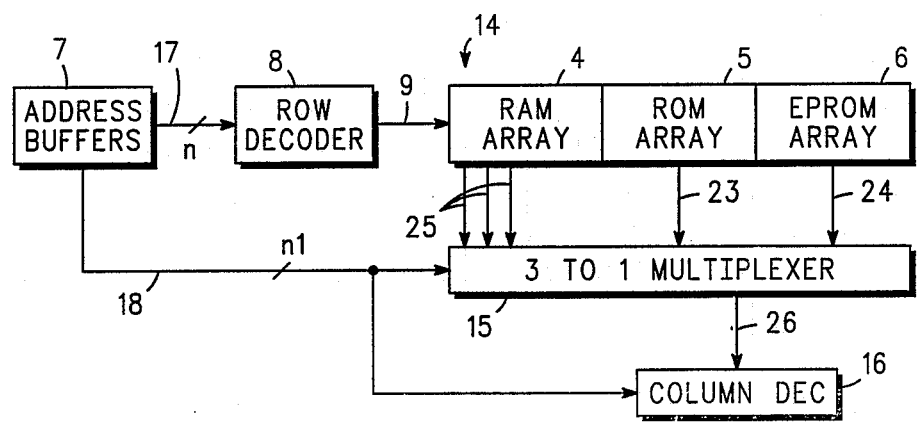
FIG. 3 is an alternative block diagram of the present invention.

An alternative structure of a combined memory array 14 is shown in FIG. 3. The numbers used in FIG. 2 are repeated in FIG. 3 to depict equivalent structures. The connections are the same in FIG. 3 as in FIG. 2 with the exception of a 3 to 1 multiplexer 15 and a column decoder 16 which replace the column decoders 11, 12, and 13. The 3 to 1 multiplexer 15 is connected in the same manner as the column decoders 11, 12, and 13 of FIG. 2 but has a plurality of bits 26 at its output connected to the column decoder 16. In this arrangement, area is saved by the simpler 3 to 1 multiplexer 15 and the single column decoder 16. However, this requires equal size words from each of the RAM array 4, the ROM array 5, and the EPROM array 6.

In FIGS. 2 and 3, it is not necessary to have equal number of bits per array. Nor is it necessary to have an equal number of words per array. If for example, the RAM array 4 had 200 words and the ROM array 5 had only 100 words, then the bottom half of the plurality of wordlines 9 would only be connected to the RAM array 4 and not to the ROM array 5. Significant savings in area is realized by combining the memory arrays since only one set of row decoders is required. Also area is saved by removing the need for redundant power bussing as well as redundant word and bit lines.

Building the combined multiple memories may be automated by the use of a silicon compiler. Compiler cells may be defined for the different memory arrays wherein the input parameters include the number of memory cells, the number of rows and columns, and the x and y pitches of the memory cells. The memory array having the largest memory cell would be layed out first to have a minimum y pitch. The remaining memory cells for each additional array would then be layed out to have the same y pitch while the x pitch is variable. Next the row decoders would be layed out to have a matching y pitch and a variable x pitch. The following step includes the addition of the column decoders that would be x pitch matched to the memory cells of their respective memory arrays. Finally the arrays and decoders would be placed and interconnected according to the common design rules.

It can be appreciated by one skilled in the art that the variety of memories that may be combined into one pitch matched system is limited only by the ability of the technology to concurrently implement the different memories on one substrate. Additional memories may include, for example, Electrically Erasable Programmable Memory (EEPROM), Programmable Read Only Memory (PROM) and Electrically Alterable Read Only Memory (EAROM).

By now it should be appreciated that there has been provided a combined memory system which merges pitch matched arrays of different types of memory. For example, Random Access Memory (RAM), Read Only Memory (ROM), Electrically Programmable ROM (EPROM), or some combination thereof.

We claim:

1. A monolithically integrated memory system, comprising:
   first means coupled for receiving an address and having a plurality of outputs for providing a plurality of digital words wherein only one of said plurality of outputs is active at any given time;
   second means having a plurality of cells for storing digital information and coupled for receiving at least one of said plurality of digital words provided at said plurality of outputs of said first means, each of said plurality of cells having an x and a y pitch; and third means coupled to said first means and having a plurality of cells for storing digital information in a manner different from said second means, said third means being spaced and aligned with respect to said second means, each of said plurality of cells having an x and a y pitch, wherein the x pitch is different than the x pitch of said plurality of cells of said second means while the y pitch of said plurality of cells of said second and third means are substantially equal.

2. The monolithically integrated memory system according to claim 1 further comprising a fourth means coupled to said first means being spaced and aligned with respect to said third means for storing digital information in a manner different from said second and third means and having a plurality of cells, each of said cells having an x and a y pitch, wherein the x pitch of said cells is not equal to the x pitch of said cells of said second and third means, and the y pitch of said cells of said fourth means is substantially equal to the y pitch of said cells of said first means.

3. The monolithically integrated memory system according to claim 2 further comprising:
a first column decoder having a plurality of decoder cells coupled to said second means, each of said decoder cells having at least one bit line coupled to at least one of the cells of said second means, said decoder cells having an x pitch substantially equal to the x pitch of the cells of said second means; and
a second column decoder having a plurality of decoder cells coupled to said third means, each of said decoder cells having at least one bit line coupled to at least one of the cells of said third means, said decoder cells having an x pitch substantially equal to the x pitch of the cells of said third means;

4. The monolithically integrated memory system according to claim 2 further comprising:
a multiplexer coupled to said second and third means for selectively receiving the digital information stored in said second and third means; and
a column decoder coupled to the multiplexer for receiving the selected digital information and further selecting the desired digital information.

5. A monolithic integrated circuit comprising:
a row decoder having a plurality of decoder cells, each of said decoder cells having a y pitch and having at least one word line;
a RAM array coupled to said row decoder and having a plurality of RAM cells, each of said RAM cells being selected by at least one of said word lines, and each of said RAM cells having an x and a y pitch wherein said RAM cells are laid out to have the same y pitch as said decoder cells; and
a ROM array coupled to said row decoder located substantially near said RAM array having a plurality of ROM cells, said plurality of ROM cells being selected by at least one of said word lines, each of said ROM cells having an x and a y pitch wherein said ROM cells are laid out in a manner such that the y pitch is equal to the y pitch of said RAM cells.

6. The monolithic integrated circuit according to claim 5 further comprising:
an EPROM array coupled to said row decoder having a plurality of EPROM cells, each of said EPROM cells being selected by at least one of said word lines, each of said EPROM cells having an x and a y pitch wherein the y pitch is equal to the y pitch of said decoder cells.

7. The monolithic integrated circuit according to claim 6 further comprising a column decoder having a plurality of decoder cells, each of said decoder cells having at least one bit line coupled to at least one of said EPROM cells, said decoder cells having an x pitch substantially equal to the x pitch of said EPROM cells.

8. The monolithic integrated circuit according to claim 6 wherein said EPROM array is an EERPROM array.

9. The monolitic integrated circuit according to claim 5 wherein said ROM array is an electrically alterable memory array.

10. The monolithic integrated circuit according to claim 5 further comprising:
a first column decoder having a plurality of decoder cells, each of said decoder cells having at least one bit line coupled to at least one of said RAM cells, said decoder cells having an x pitch substantially equal to the x pitch of said RAM cells; and
a second column decoder having a plurality of decoder cells, each of said decoder cells having at least one bit line coupled to at least one of said ROM cells, said decoder cells having an x pitch substantially equal to the x pitch of said ROM cells.

11. A method of providing the layout of a combined memory system having a decoder and first and second memory arrays, said decoder having a plurality of cells having an x and y pitch, each of said first and second memory arrays having a plurality of memory cells having an x and y pitch, the method comprising:
laying out one of said first and second memory arrays having memory cells requiring the largest area;
laying out the other one of said first and second memory arrays such that said plurality of memory cells thereof are pitched matched in the y direction to said plurality of memory cells of said one of said first and second memory arrays;
laying out said decoder wherein said plurality of cells thereof are pitched matched to said plurality of memory cells of said one of said first and second memory arrays in the y direction; and
coupling said decoder to said first and second memory arrays.

12. The method according to claim 11 wherein the cells of said decoder and the memory cells of the first and second memory arrays are pitched matched in the x direction.

* * * * *